United States Patent
Shinozuka et al.

(10) Patent No.: US 6,554,205 B1
(45) Date of Patent: Apr. 29, 2003

(54) GAS POLISHING METHOD, GAS POLISHING NOZZLE AND POLISHING APPARATUS

(75) Inventors: Syuhei Shinozuka, Kanagawa-ken (JP); Kaori Miyoshi, Kanagawa-ken (JP); Akira Fukunaga, Kanagawa-ken (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/401,719

(22) Filed: Sep. 23, 1999

Related U.S. Application Data

(62) Division of application No. 09/030,833, filed on Feb. 26, 1998, now Pat. No. 6,136,213.

(30) Foreign Application Priority Data

Feb. 26, 1997 (JP) ............................................. 9-58341

(51) Int. Cl.$^7$ ................................................. B05B 1/28
(52) U.S. Cl. .................. 239/120; 239/104; 239/589; 216/58; 216/67; 118/326; 204/298.31; 204/298.33
(58) Field of Search ................................ 239/103, 104, 239/106, 113, 120, 589; 216/58, 67; 156/345; 118/326; 438/706, 710; 134/21, 902; 204/298.31, 298.33

(56) References Cited

U.S. PATENT DOCUMENTS

| | | | | |
|---|---|---|---|---|
| 4,563,840 A | * | 1/1986 | Urakami | 239/120 X |
| 5,129,579 A | * | 7/1992 | Conte | 239/104 X |
| 5,756,155 A | * | 5/1998 | Tzeng et al. | 239/120 X |
| 5,830,334 A | * | 11/1998 | Kobayashi | 239/104 X |
| 5,980,769 A | * | 11/1999 | Yanagisawa et al. | 216/67 |

FOREIGN PATENT DOCUMENTS

| | | |
|---|---|---|
| JP | 8-017708 | 1/1996 |
| JP | 9-027482 | 1/1997 |

* cited by examiner

*Primary Examiner*—Steven J. Ganey
(74) *Attorney, Agent, or Firm*—Wenderoth, Lind & Ponack, L.L.P.

(57) ABSTRACT

A gas jetting nozzle is used for etching an object to be etched by jetting etching gas onto the object from the gas jetting nozzle. A gas jetting pipe for jetting an etching gas and a suction pipe for discharging the jetted gas are provided to have a coaxial dual pipe structure. The etching gas is jetted from the gas jetting pipe toward the object for etching and, at the same time, excess etching gas for reaction is discharged through the suction pipe.

8 Claims, 5 Drawing Sheets

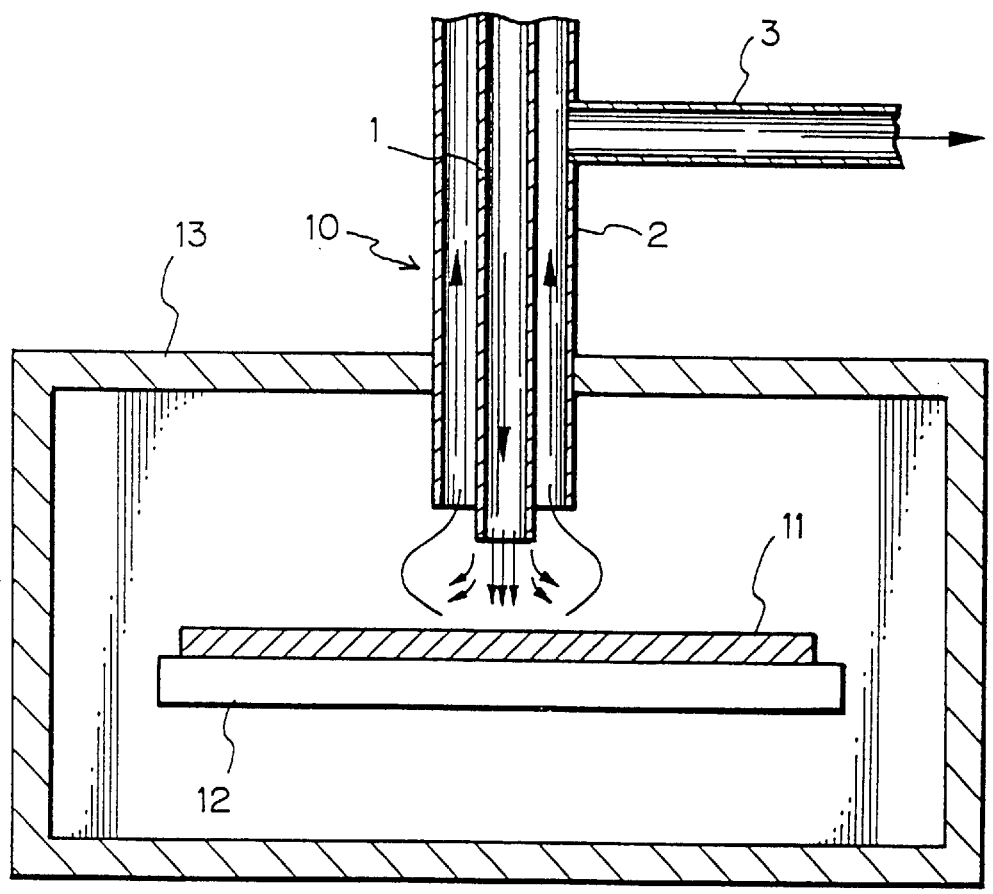

PRIOR ART

GAS POLISHING METHOD, GAS POLISHING NOZZLE AND POLISHING APPARATUS

This is a rule 1.53(b) division application Serial No. 09/030,833, filed Feb. 26, 1998, now U.S. Pat. No. 6,136,213.

BACKGROUND OF THE INVENTION

The present invention relates to a gas etching method in which an object to be etched is etched by jetting an etching gas onto the object for etching, and a jetting nozzle used in such a gas etching method.

In order to etch an object such as a silicon wafer by using a gas, generally, the etching gas is activated by plasma or the like and, at the same time, the activated gas flow is controlled by electrodes or a magnetic force. However, in some cases, the silicon wafer, poly-silicon film and/or $SiO_2$ film are etched by using only the etching gas.

In this case, regarding the etching method, as shown in FIG. 3, generally, an object for etching 101 mounted on a support 102 is entered into a reaction vessel 103. The reaction vessel is depressurized by evacuation through a discharge opening 104, and the etching gas is jetted for etching on a portion of the object to be etched from an end of an etching gas introducing pipe (nozzle) 105 for a predetermined time period.

The following formula (1) indicates only a typical chemical reaction of etching of silicon. The etching gas jetted from the end of the etching gas introducing pipe 105 is struck against the object for etching to form a reactant with the object which is gasified for effecting the etching.

$$Si+4F^* \rightarrow SiF_4\uparrow + C_2F_6 \tag{1}$$

In this case, excess gas for etching is discharged from reaction vessel 103 through discharge opening 104, as shown by the arrows in FIG. 3.

As mentioned above, although the excess gas is discharged from the reaction vessel 103 through the discharge opening 104, if a path to the discharge opening 104 is long, a portion of the object 101 other than the portion to be etched is also etched away, which is problematic. In particular, when an amount to be etched is great, such as several $\mu$m~several tens of $\mu$m, no problem would be caused. However, if the amount to be etched is small, such as several hundreds of Å~several thousands of Å, then, a great disadvantage will be caused.

SUMMARY OF THE INVENTION

The present invention is made in consideration of the above-mentioned problems, and an object of the present invention is to provide a gas etching method, a gas jetting nozzle and a gas etching apparatus which can eliminate the above-mentioned conventional drawbacks and in which only a portion of an object which is desired to be etched can be etched with high accuracy.

To achieve the above object, according to the present invention, there is provided an etching method for etching an object by jetting an etching gas onto the object from a gas jetting nozzle. A gas jetting pipe for jetting an etching gas and a suction or discharge pipe for discharging (evacuating) the etching gas jetted from the gas jetting pipe are provided. The gas jetting pipe and the suction pipe are designed to have a coaxial dual pipe structure and the etching gas is jetted from the gas jetting pipe toward the object for etching and, at the same time, excess etching gas is discharged through the discharge pipe.

The present invention further provides a gas jetting nozzle for jetting etching gas toward an object for etching, wherein a gas jetting pipe for jetting the etching gas and a suction (evacuating) pipe for discharging (evacuating) the jetted gas are provided. The gas jetting pipe and the suction pipe are designed to have a coaxial dual pipe structure.

In the gas jetting nozzle according to the present invention, in the dual pipe structure constituted by the gas jetting pipe and the suction pipe, one of the gas jetting pipe and the suction pipe is disposed on the inside, and the other of the suction pipe and the gas jetting pipe is disposed on the outside.

In the gas jetting nozzle according to the present invention, in the dual pipe structure constituted by the gas jetting pipe and the suction pipe, tip ends of both pipes are positioned flush with each other, or a tip end of one of the pipes protrudes outwardly from a tip end of the other pipe by a predetermined amount.

The present invention further provides a gas etching apparatus comprising a gas jetting nozzle according to any one of the arrangements stated above; a reaction vessel; and means for jetting an etching gas from a gas jetting pipe of the gas jetting nozzle onto an etching portion of an object positioned within the reaction vessel and, at the same time, for evacuating excess etching gas for reaction through the gas suction pipe.

As mentioned above, when the object for etching is etched by using the gas jetting nozzle having the dual pipe structure, only a portion for etching is etched, and the etching gas does not flow to a portion where etching is not desired, with the result that etching having a very sharp profile can be effected.

Therefore, according to the present invention, with the use of a gas jetting nozzle in which a gas jetting pipe and a suction pipe are designed to have a coaxial dual pipe structure, and by jetting the etching gas from the gas jetting pipe toward the object for etching and, at the same time, by discharging excess etching gas through the suction pipe, a gas etching method, a gas jetting nozzle and a gas etching apparatus in which only the portion of the object where etching is desired can be etched with high accuracy can be provided.

The above and other objects, features and advantages of the present invention will become more apparent from the following description when taken in conjunction with the accompanying drawings in which a preferred embodiment of the present invention is shown by way of illustrative examples.

BRIEF DESCRIPTION OF THE DRAWINGS

FIG. 1 is a view showing a construction of a gas jetting nozzle according to the present invention, wherein

FIG. 2 is a schematic view showing a gas etching apparatus using the gas jetting nozzle according to the present invention;

DETAILED DESCRIPTION OF PREFERRED EMBODIMENTS

Figure 1A:
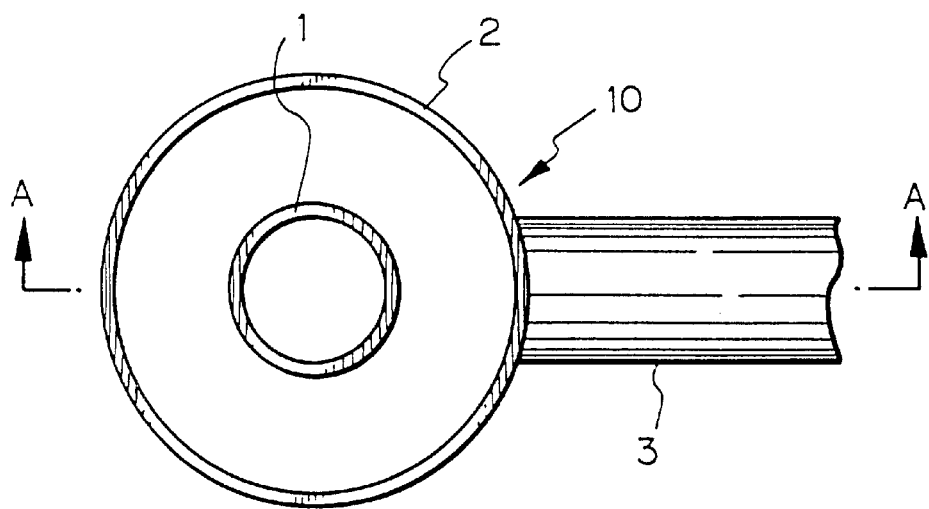
FIG. 1A is a plan view and FIG. 1B is a sectional view taken along the line A—A in FIG. 1A.
Figure 1B:
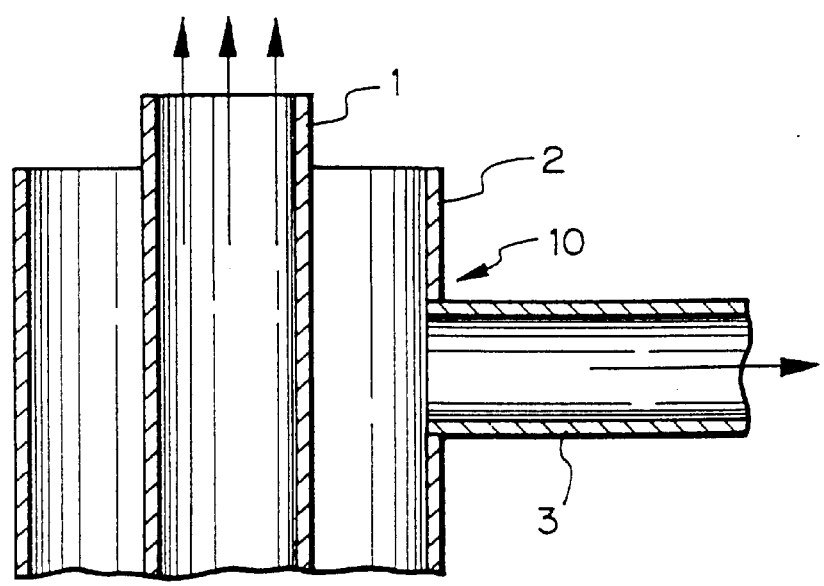

The present invention will now be explained in connection with preferred embodiments thereof with reference to the accompanying drawings. FIG. 1 shows a construction of a gas jetting nozzle according to the present invention, wherein FIG. 1A is a plan view of the gas jetting nozzle, and FIG. 1B is a sectional view taken along the line A—A in FIG. 1A. As shown, the gas jetting nozzle 10 comprises a gas jetting pipe 1 for jetting reactive etching gas, and a suction pipe 2 surrounding the gas jetting pipe and adapted to discharge excess etching gas. The gas jetting pipe 1 and the suction pipe 2 are designed as a coaxial dual pipe structure, and the suction pipe 2 is communicated with a suction pipe 3 to which a discharge or suction pump (not shown) is connected. Further, a tip end of the gas jetting pipe 1 protrudes outwardly of a tip end of the suction pipe 2 by a predetermined amount.

In the gas jetting nozzle 10 having the above-mentioned construction, the etching gas is jetted from the gas jetting pipe 1 toward an object for etching to etch the object for etching, and, at the same time, excess etching gas is immediately discharged through the suction pipe 2.

FIG. 2 is a schematic view showing a gas etching apparatus using the gas jetting nozzle having the dual pipe structure stated above. An object for etching 11, such as a silicon wafer, is placed on a support 12 disposed within a reaction vessel 13. The etching gas is jetted from the gas jetting pipe 1 of the gas jetting nozzle 10 toward an etching portion of the object 11 to etch the portion to be etched, and, at the same time, the excess etching gas is discharged through the suction pipe 2.

As mentioned above, by immediately discharging the excess etching gas jetted from the gas jetting pipe 1, but not contributing to the etching through the suction pipe 2 surrounding the gas jetting pipe 1, it is possible to prevent excess etching gas which did not contribute to the etching from etching portions other than the portion desired to be etched (the etching portion) of the object 11.

That is to say, if a gas flow path through which the excess etching gas which did not contribute to the etching reaches the discharge opening is long, there is a great possibility that it etches portions of the objection 11 other than the portion which is desired to be etched. However, by using the gas jetting nozzle having the dual pipe structure, since the excess etching gas which did not contribute to the etching is immediately evacuated from the surroundings of the gas jetting pipe 1 through the suction pipe 2, there is extremely little possibility that the portions other than the desired portion is etched.

In the illustrated embodiment, the gas jetting nozzle 10 having the dual pipe structure in which the discharge pipe 2 surrounds the gas jetting pipe 1 was explained. However, in a dual pipe structure, even when the suction pipe 2 is disposed inside and the gas jetting pipe 1 is disposed outside (i.e. the gas jetting pipe is provided so as to surround the discharge pipe), the mechanism for immediately discharging the excess etching gas which did not contribute to the etching is unchanged.

Since most of the etching gas has a high corrosion property, the gas jetting nozzle having the dual pipe structure is preferably formed of an anti-corrosion material such as SUS material, a nickel group material such as Inconel or a Teflon material. In the illustrated embodiment, the SUS material was used.

An inner diameter of the gas jetting pipe 1 for jetting the etching gas and an inner diameter of the discharge pipe 2 are determined on the basis of an amount of the etching gas to be used. In the illustrated embodiment, the inner diameter of the gas jetting pipe 1 is selected to ¼ inch, and the inner diameter of the suction pipe 2 is selected to 10.5 mm.

In the gas jetting nozzle having the dual pipe structure shown in FIG. 1, although the tip end of the gas jetting pipe 1 protrudes outwardly from the tip end of the suction pipe 2, even when the tip end of the gas, jetting pipe 1 and the tip end of the suction pipe 2 are disposed flush with each other (at the same level), or even when the tip end of the suction pipe 2 protrudes outwardly from the tip end of the gas jetting pipe 1, it was experimentally confirmed that a sufficient result can be obtained.

Figure 3:
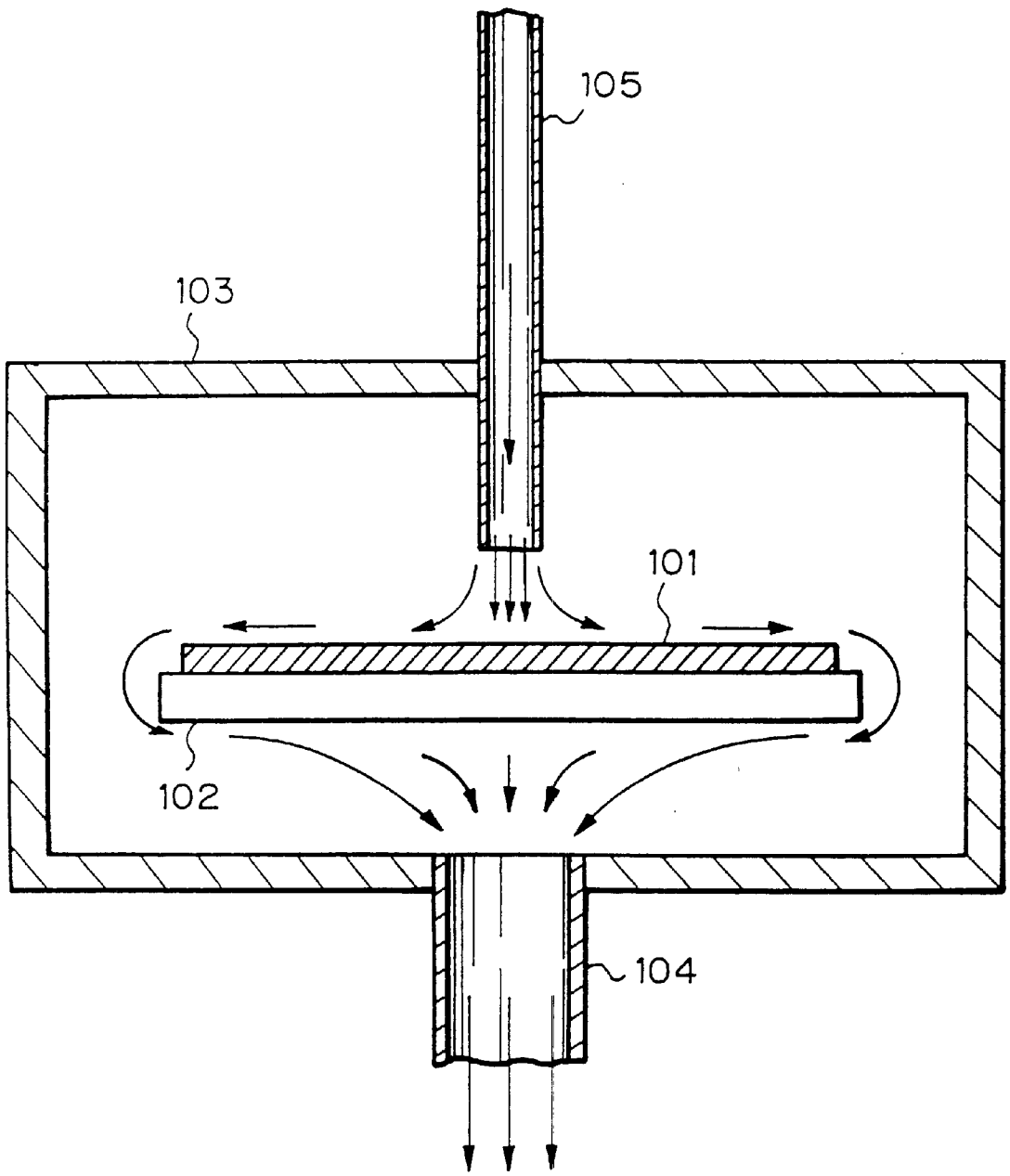
FIG. 3 is a schematic view of a conventional gas etching apparatus using a gas jetting nozzle.
Figure 4:
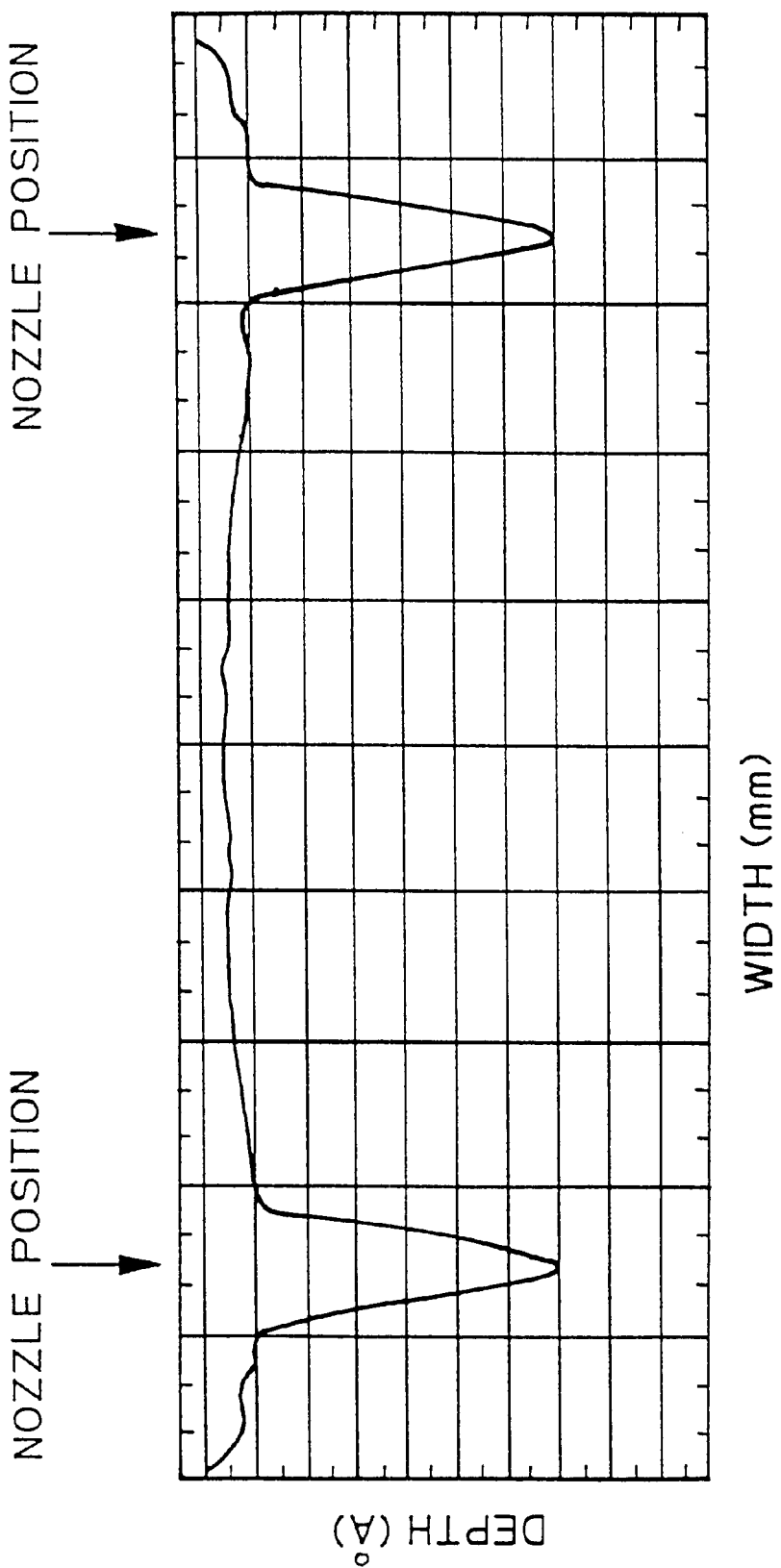
FIG. 4 is a graph showing an example wherein a silicon wafer is etched by using the gas jetting nozzle according to the present invention.
Figure 5:
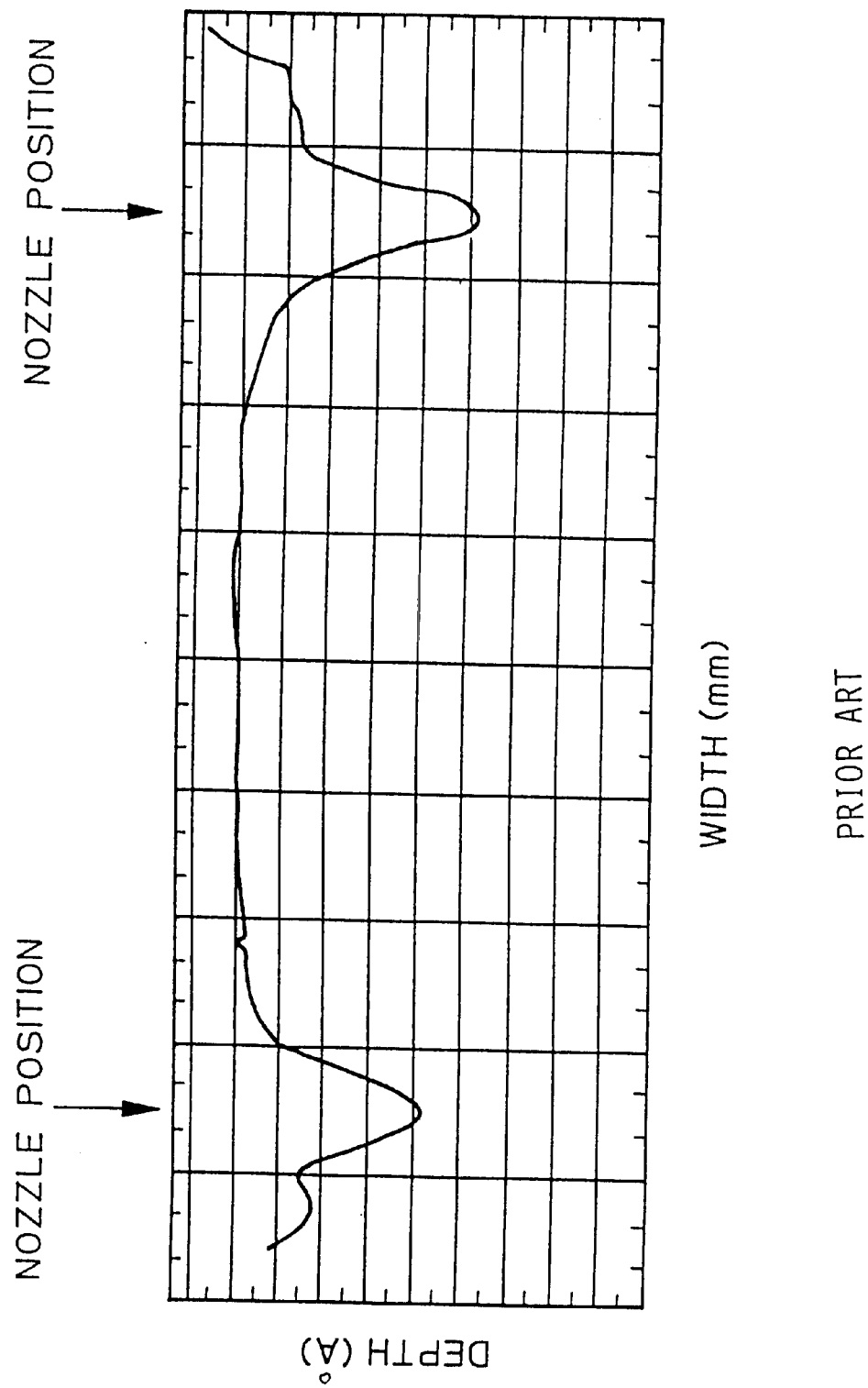
FIG. 5 is a graph showing an example wherein a silicon wafer is etched by using a conventional gas jetting nozzle.

FIG. 4 is a graph showing the results of an example wherein a silicon wafer is etched by using the gas jetting nozzle having the dual pipe structure shown in FIG. 1 (see the etching apparatus in FIG. 2), and FIG. 5 is a graph showing the results of an example wherein a silicon wafer is etched by using a gas etching apparatus utilizing a gas jetting nozzle of a single pipe structure shown in FIG. 3. Incidentally, the etching gas used in the examples is $ClF_3$ gas.

As is apparent from FIGS. 4 and 5, when the etching is effected by using the gas jetting nozzle having the dual pipe structure according to the present invention, only a portion positioned immediately below the gas jetting nozzle is etched and the etching profile is very sharp. To the contrary, as shown in FIG. 3, when the etching is effected with the etching gas introducing pipe 105 and the discharge opening 104 spaced apart from each other, even at the portion immediately below the nozzle, the etching is effected in such a manner that the skirt surrounding that portion is also widely etched, with the result that the etching profile becomes obscure.

Further, an etching amount at a central portion provided when the gas jetting nozzle having the dual pipe structure shown in FIG. 1 is used is less than ¼ of the etching amount provided when the gas jetting nozzle having the single pipe structure shown in FIG. 3 is used.

As mentioned above, when the object for etching is etched by using the gas jetting nozzle having the dual pipe structure, only the etching portion is etched, the etching gas does not flow to portion where etching is not desired and etching having a very sharp profile can be obtained.

As mentioned above, according to the present invention, since the gas jetting nozzle having constituted as a dual pipe structure where a gas jetting pipe and a suction pipe are concentrically disposed and the etching gas is jetted from the gas jetting pipe toward an object for etching and, at the same time, the excess etching gas for reaction is discharged through the suction pipe, a gas etching method, a gas jetting nozzle and a gas etching apparatus in which only the desired portion for etching is etched with high accuracy can be provided.

What is claimed is:

1. A gas jetting and evacuating nozzle for jetting etching gas toward an object to be etched and evacuating excess etching gas, comprising:

a gas jetting pipe adapted to jet an etching gas; and a suction pipe adapted to evacuate the jetted gas;

wherein said gas jetting pipe and said suction pipe form a coaxial dual pipe structure;

wherein said gas jetting pipe has a tip end having an etching gas flow path that is linearly parallel with said coaxial dual pipe structure; and wherein said tip end of said gas jetting pipe entends outwardly beyond a tip end of said suction pipe.

2. The gas jetting nozzle of claim 1, wherein said gas jetting pipe is inside of said suction pipe.

3. The gas jetting nozzle of claim 1, wherein said gas jetting pipe and said suction pipe are made of an anti-corrosion material.

4. The gas jetting nozzle of claim 1, wherein said anti-corrosion material is selected from the group consisting of SUS material, a nickel group matrial and Teflon material.

5. A gas etching apparatus, comprising:

a reaction vessel;

a gas jetting and evacuating nozzle for jetting etching gas toward an object to be etched and evacuating excess etching gas, comprising a gas jetting pipe adapted to jet an etching gas and a suction pipe adapted to evacuate the jetted gas, wherein said gas jetting pipe and said suction pipe form a coaxial dual pipe structure, said dual pipe structure communicating with said reaction vessel; and means for jetting an etching gas from said gas jetting pipe onto an etching portion of an object to be etched positioned within said reaction vessel and simultaneously removing excess etching gas through said suction pipe;

wherein said gas jetting pipe has a tip end having an etching gas flow path that is linearly parallel with said coaxial dual pipe structure; and wherein said tip end of said gas jetting pipe extends outwardly beyond a tip end of said suction pipe.

6. The gas etching apparatus of claim 5, wherein said gas jetting pipe is inside of said suction pipe.

7. The gas jetting nozzle of claim 5, wherein said gas jetting pipe and said suction pipe are made of an anti-corrosion material.

8. The gas jetting nozzle of claim 5, wherein said anti-corrosion material is selected from the group consisting of SUS material, a nickel group matrial and Teflon material.

* * * * *